(12) United States Patent
Neumann et al.

(10) Patent No.: US 10,642,832 B1
(45) Date of Patent: May 5, 2020

(54) REDUCING THE DOMAIN OF A SUBQUERY BY RETRIEVING CONSTRAINTS FROM THE OUTER QUERY

(71) Applicant: Tableau Software, Inc., Seattle, WA (US)

(72) Inventors: Thomas Neumann, Munich (DE); Viktor Leis, Munich (DE); Alfons Kemper, Munich (DE)

(73) Assignee: Tableau Software, Inc., Seattle, WA (US)

( * ) Notice: Subject to any disclaimer, the term of this patent is extended or adjusted under 35 U.S.C. 154(b) by 350 days.

(21) Appl. No.: 15/706,587

(22) Filed: Sep. 15, 2017

Related U.S. Application Data

(60) Provisional application No. 62/418,246, filed on Nov. 6, 2016.

(51) Int. Cl.
*G06F 7/00* (2006.01)
*G06F 16/2453* (2019.01)

(52) U.S. Cl.
CPC .. *G06F 16/24542* (2019.01); *G06F 16/24535* (2019.01); *G06F 16/24537* (2019.01)

(58) Field of Classification Search
CPC ......... G06F 16/24542; G06F 16/24537; G06F 16/24535; G06F 16/2453; G06F 16/24545; G06F 2206/1504

USPC ................................ 707/713, 718, 719, 714
See application file for complete search history.

(56) References Cited

U.S. PATENT DOCUMENTS

| | | | | |
|---|---|---|---|---|
| 5,379,422 A | * | 1/1995 | Antoshenkov | G06F 16/13 |
| 2009/0228414 A1 | * | 9/2009 | Dumeur | G06N 3/126 706/13 |
| 2010/0191720 A1 | * | 7/2010 | Al-Omari | G06F 16/24542 707/718 |
| 2011/0137890 A1 | * | 6/2011 | Bestgen | G06F 16/24544 707/719 |

* cited by examiner

*Primary Examiner* — Mohammed R Uddin
(74) *Attorney, Agent, or Firm* — Morgan, Lewis & Bockius LLP

(57) ABSTRACT

A database engine receives a human-readable database query that includes a subquery, and parses the database query to build an operator tree. The operator tree includes a subtree corresponding to the subquery. The database engine estimates the number of rows that will accessed when the subtree is executed and estimates the fraction of the cardinality of rows that will be filtered out by subsequent operations in the operator tree. In accordance with a determination that the estimated fraction exceeds a first threshold, the database engine inserts a domain constraint into the subtree that restricts rows retrieved by execution of the subtree, thereby forming a modified operator tree. The database engine executes the modified operator tree to form a final result set corresponding to the database query and returns the final result set.

18 Claims, 13 Drawing Sheets

```
select
     s.acctbal,
     s.name AS s_name,
     n.name AS n_name,
     p.partkey,
     p.mfgr,
     s.address,
     s.phone,
     s.comment
from
     part p,
     supplier s,
     partsupp ps,
     nation n,
     region r
where
         p.partkey      = ps.partkey
     and s.suppkey      = ps.suppkey
     and p.size         = 15
     and p.type         like '%BRASS'
     and s.nationkey    = n.nationkey
     and n.regionkey    = r.regionkey
     and r.name         = 'EUROPE'
     and ps.supplycost = (
         select
             min(ps.supplycost)
         from
             partsupp ps,
             supplier s,
             nation n,
             region r
         where
                 p.partkey     = ps.partkey
             and s.suppkey     = ps.suppkey
             and s.nationkey   = n.nationkey
             and n.regionkey   = r.regionkey
             and r.name        = 'EUROPE'
     )
order by
     s.acctbal desc,
     n.name,
     s.name,
     p.partkey
limit 100
```

Figure 4A

```
// Consider introducing early probes
static constexpr double probeOverhead = 1.1;
if ((!earlyProbesDisabled)&&(method==Method::Hash)&&(!preserveRight(getJoinType())&&(left->estimat
eCardinality()*condition->estimateDistribution()->estimateSelectivity()*probeOverhead<1.0)) {
    vector<const algebra::IU*> rightIUs;
    for (auto e:desc.right)
        if (dynamic_cast<const IURef*>(e))
            rightIUs.push_back(static_cast<const IURef*>(e)->getIU()); else
                break;
    if (rightIUs.size()==desc.right.size()) {
        IUSet ius; for (auto iu:rightIUs) ius.insert(iu);
        introduceEarlyProbes(this,ius,move(rightIUs),right,false);
    }
} else {
    left->optimize(pass,left);
    right->optimize(pass,right);
    condition->optimize(pass,condition,true);
}
```

Figure 7A

```
static void introduceEarlyProbes(Join* join,const IUSet& ius,vector<const algebra::IU*>&& values,unique_ptr
<Operator>& ref,bool belowPipelinebreaker)
   // Introduce an early probe
{
   // Try to go further down
   if (auto b=dynamic_cast<BinaryOperator*>(ref.get())) {
      if (b->isLeftLinearO&&(ius.subsetOf(b->getLeft().getProduced())))
         return introduceEarlyProbes(join,ius,move(values),b->left,dynamic_cast<Join*>(ref.get()));
      if (b->isRightLinearO&&(ius.subsetOf(b->getRight().getProduced())))
         return introduceEarlyProbes(join,ius,move(values),b->right,belowPipelinebreaker);
   } else if (auto g=dynamic_cast<GroupBy*>(ref.get())) {
      vector<const algebra::IU*> mappedIUs=values;
      if (g->mapResultIUs(mappedIUs)) {
         IUSet inputIUs; for (auto iu:mappedIUs) inputIUs.insert(iu);
         return introduceEarlyProbes(join,inputIUs,move(mappedIUs),g->input, true);
      }
   } else if (auto u=dynamic_cast<UnaryOperator*>(ref.get()) {
      if (u->isLinearO&&(ius.subsetOf(u->getInput().getProduced())))
         return introduceEarlyProbes(join,ius,move(values),u->input,belowPipelinebreaker);
   }
   // Not possible, introduce a probe here if beneficial
   if (belowPipelinebreaker) {
      ref=make_unique<EarlyProbe>(move(ref),move(values),join);
   }
}
```

Figure 7B

REDUCING THE DOMAIN OF A SUBQUERY BY RETRIEVING CONSTRAINTS FROM THE OUTER QUERY

RELATED APPLICATIONS

This application claims priority to U.S. Provisional Application Ser. No. 62/418,246, filed on Nov. 6, 2016, entitled "High Performance Relational Database System," which is incorporated by reference herein in its entirety.

TECHNICAL FIELD

The disclosed implementations relate generally to relational database systems, and more specifically to system features that improve query execution performance.

BACKGROUND

Data visualization applications enable a user to understand a data set visually, including distribution, trends, outliers, and other factors that are important to making business decisions. Some data sets are very large or complex, and include many data fields. Various tools can be used to help understand and analyze the data, including dashboards that have multiple data visualizations.

Data is commonly stored in a relational database and accessed by queries using a prescribed syntax (e.g., SQL). As volatile memory has become less expensive, database system may cache more data in memory to improve performance. Some database systems attempt to work almost entirely in memory, and take advantage of the high-speed access. Historically, the time to execute a query was dominated by the time required to read data from disks. As disk access time becomes an overall smaller portion of query execution time (especially for an in-memory database), the internal execution plan becomes more critical.

Although a database "server" is commonly envisioned as a remote system with high-end hardware to simultaneously provide database access to many client devices, a database server can also reside on a person's computer (e.g., laptop or desktop computer), in which case the amount of memory may be much more limited than a large dedicated server and the processing power may be much more limited as well. This further accentuates the need for intelligent construction of query execution plans.

SUMMARY

Accordingly, implementations of the present invention are directed to a database engine. The database engine includes an optimizer that inserts domain constraints when appropriate to improve query processing. This particular type of optimization applies when a query includes a subquery that satisfies certain conditions. First, the query parser generates an execution plan that includes a subtree corresponding to the subquery. In some implementations, when the subtree will generate a large intermediate result set and a large percentage of the intermediate results will be eliminated during subsequent operations, the optimizer inserts a domain constraint early in the operator tree to reduce memory and processor usage. In some implementations, the domain constraint is added based on just the percentage of the intermediate results will be eliminated during subsequent operations. The domain constraint enables more efficient query processing for queries that would generally produce very large intermediate result sets that are unnecessary to the final result set.

In accordance with some implementations, a database engine operates at a computer system having one or more computing devices. Each computing device has one or more processors and memory, and the memory stores one or more programs configured for execution by the one or more processors. The database engine receives a human-readable database query that includes a subquery, and parses the database query to build an operator tree. The operator tree includes a subtree corresponding to the subquery. The database engine estimates the cardinality of rows in database tables specified in the subtree. The database engine also estimates the fraction of the estimated cardinality of rows that do not satisfy a filter condition specified in one or more subsequent operations in the operator tree (i.e., what fraction of rows will be filtered out). When the estimated fraction exceeds a first threshold, the database engine inserts a domain constraint into the subtree. The domain constraint corresponds to the filter condition. Inserting the domain constraint forms a modified operator tree in which execution of the subtree restricts rows retrieved according to the filter condition. The database engine executes the modified operator tree to form a final result set corresponding to the database query, and returns the final result set.

In some implementations, inserting the domain constraint into the subtree is further based on determining that the estimated cardinality of rows exceeds a second threshold.

In some implementations, the database engine estimates the fraction of the estimated cardinality of rows that do not satisfy the filter condition by selecting a sample of rows from the database tables specified in the subtree. The database engine executes at least a portion of the operator tree, including the subtree and operators in the operator tree that specify the filter condition, using the selected sample of rows. The estimated fraction is based on the number of the sample rows that are filtered out in the execution of the filter condition.

In accordance with some implementations, a method is performed at a database engine having one or more computing devices. Each of the one or more computing devices has one or more processors and memory storing one or more programs configured for execution by the one or more processors. The one or more programs execute to retrieve data from a database (e.g., an SQL database). The database engine receives a human-readable database query (e.g., an SQL expression) that includes a subquery (e.g., at least one subquery) and parses the database query to build an operator tree. The operator tree includes a subtree corresponding to the subquery. The database engine estimates the cardinality of rows that will be accessed by execution of the subtree and estimates a fraction of the cardinality of rows that will be filtered out by subsequent operations in the operator tree. When the estimated cardinality exceeds a first threshold and the estimated fraction exceeds a second threshold, the database engine inserts a domain constraint into the subtree that restricts rows retrieved by execution of the subtree, thereby forming a modified operator tree. The database engine executes the modified operator tree to form a final result set corresponding to the database query, and returns the final result set.

In some implementations, estimating the cardinality of rows that will be accessed by execution of the subtree includes estimating the number of rows in an intermediate result set that will be created by execution of the subtree. In some implementations, estimating the fraction of the cardinality of rows that will be filtered out by subsequent operations in the operator tree includes determining the number of rows in the intermediate result set of the subtree that will not be used to form the final result set.

In some implementations, the inserted domain constraint uses an early-probe operator that compares rows generated from execution of the subtree to a hash table of a second subtree in the operator tree. In some implementations, the second subtree is more than one operator ahead of the subtree in the operator tree.

In some implementations, the inserted domain constraint imposes a filter on the subtree corresponding to the rows that will be filtered out by subsequent operations in the operator tree.

In some implementations, executing the modified operator tree creates an intermediate result set for the subquery whose cardinality is substantially less than the estimated cardinality of accessed rows according to the estimated fraction. In some implementations, the intermediate result set for the subquery has a cardinality that is "substantially less" than the estimated cardinality of access rows when the cardinality of the intermediate result set is 5%, 10%, or 25% of the estimated cardinality of accessed rows.

In some implementations, when the estimated cardinality does not exceed the first threshold, the database engine forgoes insertion of the domain constraint into the subtree.

In some implementations, when the estimated fraction does not exceed the second threshold, the database engine forgoes insertion of the domain constraint into the subtree.

In some implementations, estimating the cardinality of rows retrieved by execution of the subtree includes identifying a plurality of database tables specified in the sub query and determining the respective number of rows in each of the plurality of database tables according to statistics stored at the database.

In some implementations, a non-transitory computer readable storage medium stores one or more programs configured for execution by a computing device having one or more processors and memory. The one or more programs include instructions for performing any of the methods described herein.

In some implementations, a database engine executes at one or more computing devices, each having one or more processors and memory. The memory stores one or more programs configured for execution by the one or more processors and the one or more programs include instructions for performing any of the methods described herein.

Thus methods, systems, and computer readable media are disclosed that provide more efficient processing by inserting domain constraints into subtrees of operator trees for database queries.

Both the foregoing general description and the following detailed description are exemplary and explanatory and are intended to provide further explanation of the invention as claimed.

BRIEF DESCRIPTION OF THE DRAWINGS

For a better understanding of the aforementioned systems and methods that provide efficient database query processing, reference should be made to the Description of Implementations below, in conjunction with the following drawings in which like reference numerals refer to corresponding parts throughout the figures.

FIG. 4A illustrates an exemplary database query that includes a subquery, in accordance with some implementations.

FIGS. 7A and 7B provide source code for inserting a domain constraint into an operator tree and determining when to insert such a domain constrain, in accordance with some implementations.

Reference will now be made to implementations, examples of which are illustrated in the accompanying drawings. In the following description, numerous specific details are set forth in order to provide a thorough understanding of the present invention. However, it will be apparent to one of ordinary skill in the art that the present invention may be practiced without requiring these specific details.

DESCRIPTION OF IMPLEMENTATIONS

Figure 1:
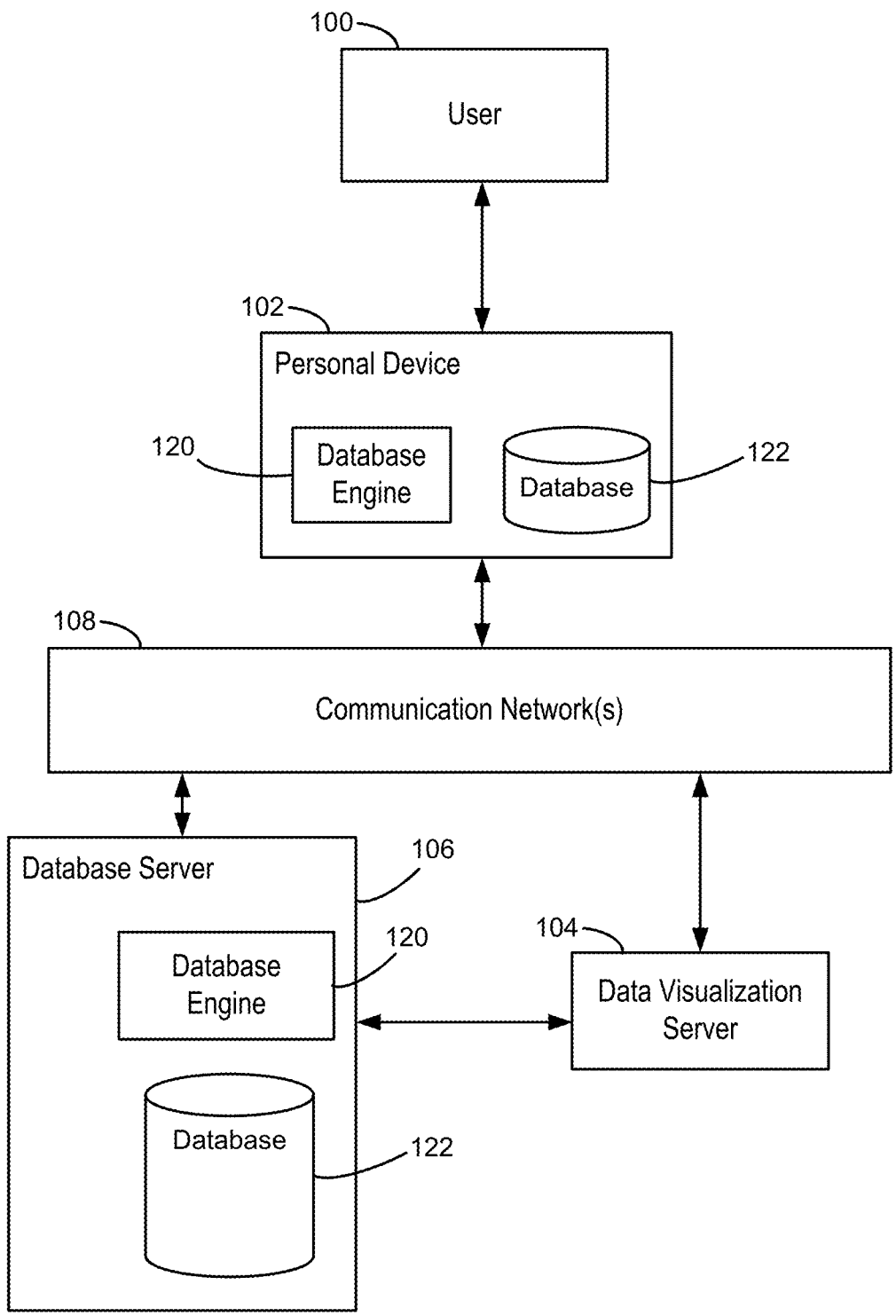
FIG. 1 illustrates the context for a database system in accordance with some implementations.

FIG. 1 illustrates a context in which some implementations operate. A user 100 interacts with a personal device 102, such as a desktop computer, a laptop computer, a tablet computer, or a mobile computing device. A personal device 102 is an example of a computing device 200. The term "computing device" also includes server computers, which may be significantly more powerful than a personal device used by a single user, and are generally accessed by a user only indirectly. An example computing device 200 is described below with respect to FIG. 2, including various software programs or modules that execute on the device 200. In some implementations, the personal device 102 includes one or more desktop data sources 224 (e.g., CSV files or spreadsheet files). In some implementations, the personal device 102 includes a database engine 120, which provides access to one or more relational databases 122 (e.g., SQL databases). In some implementations, the personal device includes a data visualization application 222, which the user 100 uses to create data visualizations from the desktop data sources 224 and/or the relational databases 122. In this way, some implementations enable a user to visualize data that is stored locally on the personal device 102.

In some cases, the personal device 102 connects over one or more communications networks 108 to one or more external database servers 106 and/or a data visualization server 104. The communication networks 108 may include local area networks and/or wide area networks, such as the Internet. In some implementations, the data visualization server 104 provides a data visualization web application that runs within a web browser 220 on the personal device 102. In some implementations, data visualization functionality is provided by a local application 222 with certain functions provided by the data visualization server 104. For example, the data visualization server 104 may be used for resource intensive operations. In some implementations, the one or more database servers 106 include a database engine 120, which provides access to one or more databases 122 that are stored at the database server 106. As illustrated in FIG. 1, a database engine 120 and corresponding databases 122 may reside on either a local personal device 102 or on a database server 106. In some implementations (not illustrated here), the data visualization server 104 includes a database engine 120 and one or more databases 122.

Figure 2:
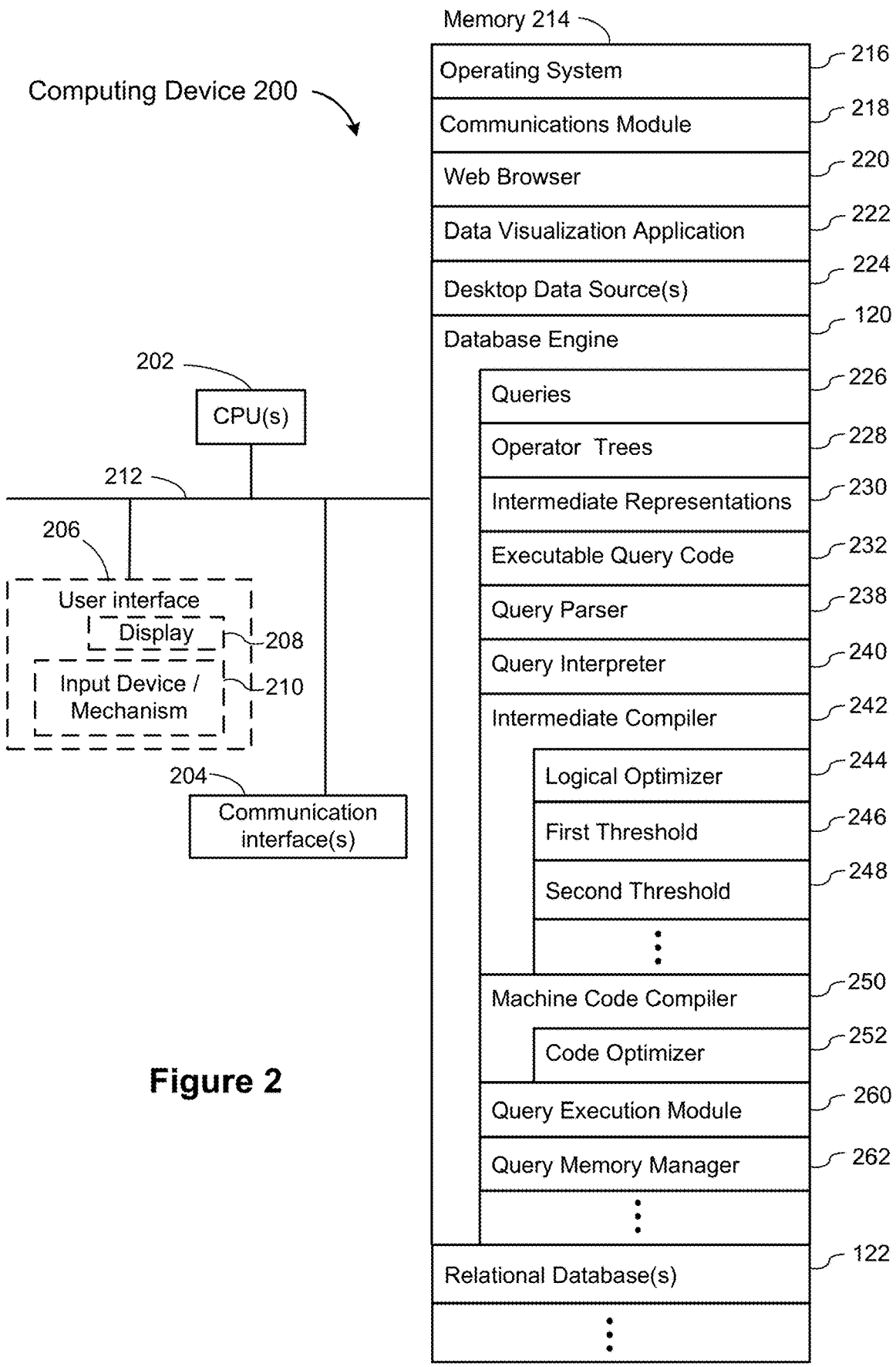
FIG. 2 is a block diagram of a computing device according to some implementations.

FIG. 2 is a block diagram illustrating a computing device 200 in accordance with some implementations. As used herein, the term "computing device" includes both personal devices 102 and servers, such as a database server 106 or a data visualization server 104. A computing device 200 typically includes one or more processing units/cores (CPUs) 202 for executing modules, programs, and/or instructions stored in the memory 214 and thereby performing processing operations; one or more network or other communications interfaces 204; memory 214; and one or more communication buses 212 for interconnecting these components. The communication buses 212 may include circuitry that interconnects and controls communications between system components. A computing device 200 may include a user interface 206 comprising a display device 208 and one or more input devices or mechanisms 210. In some implementations, the input device/mechanism 210 includes a keyboard. In some implementations, the input device/mechanism includes a "soft" keyboard, which is displayed as needed on the display device 208, enabling a user to "press keys" that appear on the display 208. In some implementations, the display 208 and input device/mechanism 210 comprise a touch screen display (also called a touch sensitive display). In some implementations, the memory 214 includes high-speed random-access memory, such as DRAM, SRAM, DDR RAM, or other random access solid state memory devices. In some implementations, the memory 214 includes non-volatile memory, such as one or more magnetic disk storage devices, optical disk storage devices, flash memory devices, or other non-volatile solid-state storage devices. In some implementations, the memory 214 includes one or more storage devices remotely located from the CPU(s) 202. The memory 214, or alternatively the non-volatile memory device(s) within the memory 214, comprises a non-transitory computer readable storage medium. In some implementations, the memory 214, or the computer readable storage medium of the memory 214, stores the following programs, modules, and data structures, or a subset thereof:
- an operating system 216, which includes procedures for handling various basic system services and for performing hardware dependent tasks;
- a communications module 218, which is used for connecting the computing device 200 to other computers and devices via the one or more communication network interfaces 204 (wired or wireless) and one or more communication networks 108, such as the Internet, other wide area networks, local area networks, metropolitan area networks, and so on;
- a web browser 220 (or other client application), which enables a user 100 to communicate over a network with remote computers or devices. In some implementations, the web browser 220 executes a data visualization web application (not shown) downloaded from a data visualization server 104. In some implementations, a data visualization web application (not shown) is an alternative to storing a data visualization application 222 locally;
- a data visualization application 222, which enables users to construct data visualizations from various data sources. The data visualization application 222 retrieves data from one or more data sources, such as a desktop data source 224 (e.g., a CSV file or a flat file), a relational database 122 stored locally, or a desktop data source or relational database 122 stored on another device (such as a database server 106). The data visualization application then generates and displays the retrieved information in one or more data visualizations;
- zero or more desktop data sources 224, which have data that may be used and displayed by the data visualization application 222. Data sources 224 can be formatted in many different ways, such as spreadsheets, XML files, flat files, CSV files, text files, JSON files, or desktop database files. Typically, the desktop data sources 224 are used by other applications as well (e.g., a spreadsheet application);
- a database engine 120, which receives database queries 226 (e.g., query from a data visualization application 222) and returns corresponding data. The database engine 120 typically includes a plurality of executable modules;
- the database engine 120 invokes a query parser 238, which parses each received query 226 (e.g., SQL database query) to form an operator tree 228. An operator tree is sometimes referred to as an expression tree, an algebra tree, or an execution tree. In some implementations, the query parser 238 is contained within the intermediate compiler 242;
- the database engine 120 includes an intermediate compiler 242, which translates each operator tree 228 into an intermediate representation (IR) 230 (e.g., LLVM code). In some implementations, the intermediate compiler 242 includes a logical optimizer 244, which modifies an operator tree 228 to produce a (theoretically) more efficient execution plan. The logical optimizer 244 is generally capable of identifying multiple types of optimization based on the structure of the operator tree and the data requested. Some implementations identify when to apply a domain constraint to a subtree within an operator tree 228. In some implementations, the logical optimizer identifies when to apply a domain constraint based on comparing one or more estimated cardinalities to one or more threshold values (e.g., a first threshold 246 and/or a second threshold 248, as illustrated below in FIGS. 5A and 5B);
- in some implementations, the database engine 120 includes a query interpreter 240 (also called a byte code interpreter), which interprets the intermediate representation directly to retrieve result sets from the databases 122;
- in some implementations, the database engine 120 includes a machine code compiler 250, which translates an intermediate representation into executable machine code 232. In some implementations, the machine code compiler 250 selects between in-memory operators and spooling operators depending on available memory;
- in some implementations, the machine code compiler 250 includes a code optimizer 252, which performs one or more optimization passes on the intermediate representation 230 to form an optimized intermediate representation 230. The optimized intermediate representation is then translated into optimized executable machine code 232 by the machine code compiler 250. In some implementations, the code optimizer 252 selects between in-memory operators and spooling operators depending on available memory;

in some implementations, the database engine 120 includes a query execution module 260, which executes the executable machine code 232 generated by the machine code compiler 250. In some implementations, the query execution module 260 includes an abort module, which can abort the execution of the code (e.g., upon detecting an out of memory condition). In some implementations, the abort module communicates with the machine code compiler 250 or the code optimizer 252 to recompile the intermediate representation after execution is aborted. In some implementations, the query execution module 260 includes a result reuse module, which stores and reuses intermediate results that were created during a previous execution that was aborted; and the database engine 120 also includes a query memory manager 262, which tracks memory utilization by each of the processes, and dynamically allocates memory as needed. In some implementations, the memory manager 262 detects when there is insufficient memory while executing the compiled code. In some implementations, the query memory manager 262 communicates with the query execution module 260.

Each of the above identified executable modules, applications, or sets of procedures may be stored in one or more of the previously mentioned memory devices, and corresponds to a set of instructions for performing a function described above. The above identified modules or programs (i.e., sets of instructions) need not be implemented as separate software programs, procedures, or modules, and thus various subsets of these modules may be combined or otherwise rearranged in various implementations. In some implementations, the memory 214 stores a subset of the modules and data structures identified above. Furthermore, in some implementations, the memory 214 stores additional modules or data structures not described above.

Although FIG. 2 shows a computing device 200, FIG. 2 is intended more as a functional description of the various features that may be present rather than as a structural schematic of the implementations described herein. In practice, and as recognized by those of ordinary skill in the art, items shown separately could be combined and some items could be separated.

In a query language such as SQL, subqueries can be correlated to outer queries that further process the results of the subqueries. If the subquery is processed independently of the outer query (which uses the intermediate results of the subquery), the evaluation of the subquery may generate a very large intermediate result set. In many cases, only a small subset of the intermediate result set is actually needed for the further processing.

Disclosed implementations introduce domain constraints from the outer query into the subquery in order to constrain the processing, producing relevant intermediate results that limit the results that are not actually needed for processing the outer query. In some implementations, this process uses "early probes" of a hash join table built for the outer query, thereby imposing a filter constraint on the subquery. Some implementations use a Bloom filter that is created from the hash join table for the outer query. A Bloom filter can filter out many rows from the execution of the subtree that would be filtered out later anyway. Note that a Bloom filter may not filter out all of the rows that will be filtered later. However, in some implementations, filtering out a large portion of the "debris" while incurring a low overhead cost is an effective way to reduce the overall processing time. \\Poozer\97386

Standard relational database query engines rely on relational algebra trees (e.g., an operator tree 228) for evaluating logically optimized plans. A typical algebra tree 228 has the nice property that its leaves correspond to base relations and each node in the tree 228 can be evaluated based solely on nodes of its subtree. To evaluate a node in the tree, a typical "iterator engine" works by pulling intermediate results from the subtrees corresponding to children of the node.

Although the simplicity of the pull-based model is nice, it has some fundamental limitations. A subtree cannot "know" which of its intermediate results are really needed for further processing the query. Therefore, each subtree computes all of its subquery results and passes them to the parent node. This is illustrated in FIG. 3.

Figure 3:
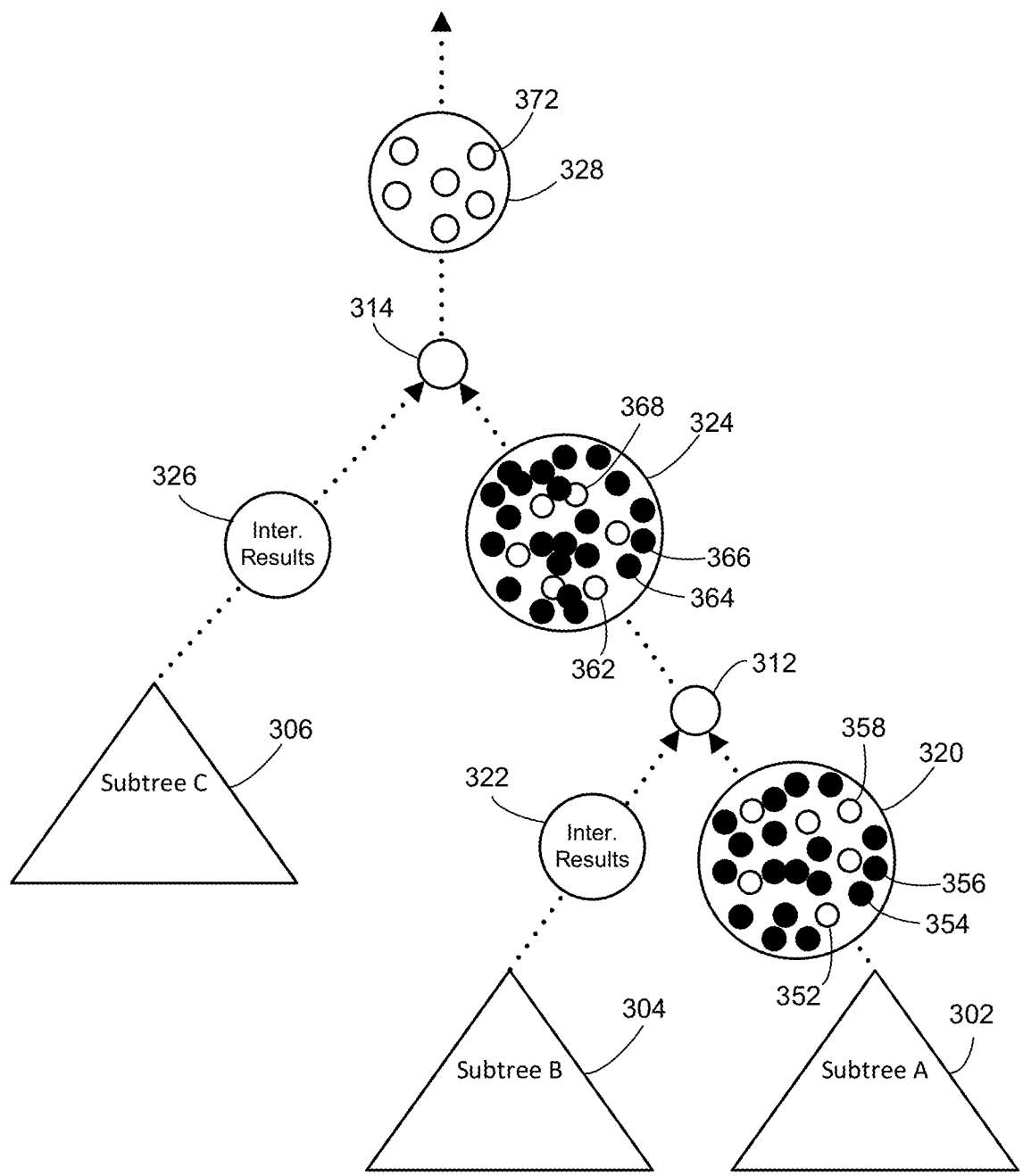
FIG. 3 illustrates generally a plurality of operations in an operator tree and the result sets formed by executing the operations, according to some implementations.

FIG. 3 illustrates a portion 300 of an operator tree 228. This portion includes three subtrees (subtree A 302, subtree B 304, and subtree C 306). When illustrated in this way, the operator tree 228 is executed in a bottom up order. For example, the bottom subtrees 302 and 304 can be executed independently (potentially in parallel), and after both of these subtrees have generated their respective intermediate results 320 and 322, the next operator 312 can be applied. This operator 312 creates its own intermediate results 324, which are then combined by the upper operator 314 with the intermediate results 326 from the third subtree 306. The upper operator 314 creates its results 328. If the upper operator 314 is the final operator in the operator tree 228 (e.g., the portion 300 is the entire operator tree 228), then the upper results 328 are the final results that are returned to the client. On the other hand, the upper results 328 may be intermediate results for which additional operators are applied (e.g., binary operators or unary operators).

The intermediate results on the rightmost branch of the operator tree 228 are represented by individual dots, each representing a row in the respective intermediate results. (Of course, the intermediate results in an actual query may have thousands, millions, or billions of rows.) The shading of the dots here indicates which of the results are actually used in subsequent operations to form the final result set for the query. The unfilled dots, such as the dots 352 and 358 in the first intermediate result set 320, are the ones that are subsequently used in the final result set. The filled dots, such as the dots 354 and 356 in the first intermediate result set 320, represent rows that will not be used to create the final result set for the query. In this example, the intermediate result set 320 for the first subtree 302 includes a large percentage of rows that will not ultimately be used.

The lower operation 312 (a join between the intermediate results 320 and 322) produces another set of intermediate results 324 with a large number of rows that will not ultimately be used (e.g., represented by the dots 364 and 366). The number of rows that will ultimately be used (e.g., represented by the dots 362 and 368) is a much smaller number.

The upper operation 314 (another join), produces a result set 328 with a much smaller number of rows (e.g., the row represented by the dot 372). In the result set 328 all of the dots are unfilled, indicating that all of the rows will be used.

As illustrated here, sometimes an intermediate result set early in the operator tree 228 has a very large number of rows that will not ultimately be used. Disclosed implementations identify this situation, and modify the operator tree to reduce the overhead. This can reduce processing time as well as memory usage. In some implementations, the situation illustrated here is identified by two conditions. First, the intermediate result set has to be large enough to justify the additional cost of modifying the execution plan. Second, a substantial percentage of the rows in the intermediate result set have to be ones that will be filtered out later. In some implementations, a substantial percentage is 75%, 90%, or 95%.

As illustrated in FIG. 3, the subsequent operation (e.g., the upper operation 314) that filters the results is two operators away from the first subtree 302. Therefore, when determining whether intermediate results from a subtree will be substantially filtered out later, the optimizer 244 looks at all subsequent operators in the operator tree, and not just the next one.

In accordance with some implementations, the database engine 120 (e.g., the optimizer 244 within the database engine) opportunistically detects the situation just described. In particular, the optimizer 244 detects those cases where a subtree in the query plan 228 generates many useless data objects (i.e., those that are filtered out in later processing stages).

From a different perspective, the optimizer 244 looks for beneficial filters in other parts of the query tree 228 that can be used to reduce the cardinality of a particular subtree. The optimizer 244 inspects other subtrees for filter predicates that would later on in the tree reduce the intermediate results of the current subtree. Instead of waiting, these filters are applied at an early stage.

Figure 4B:
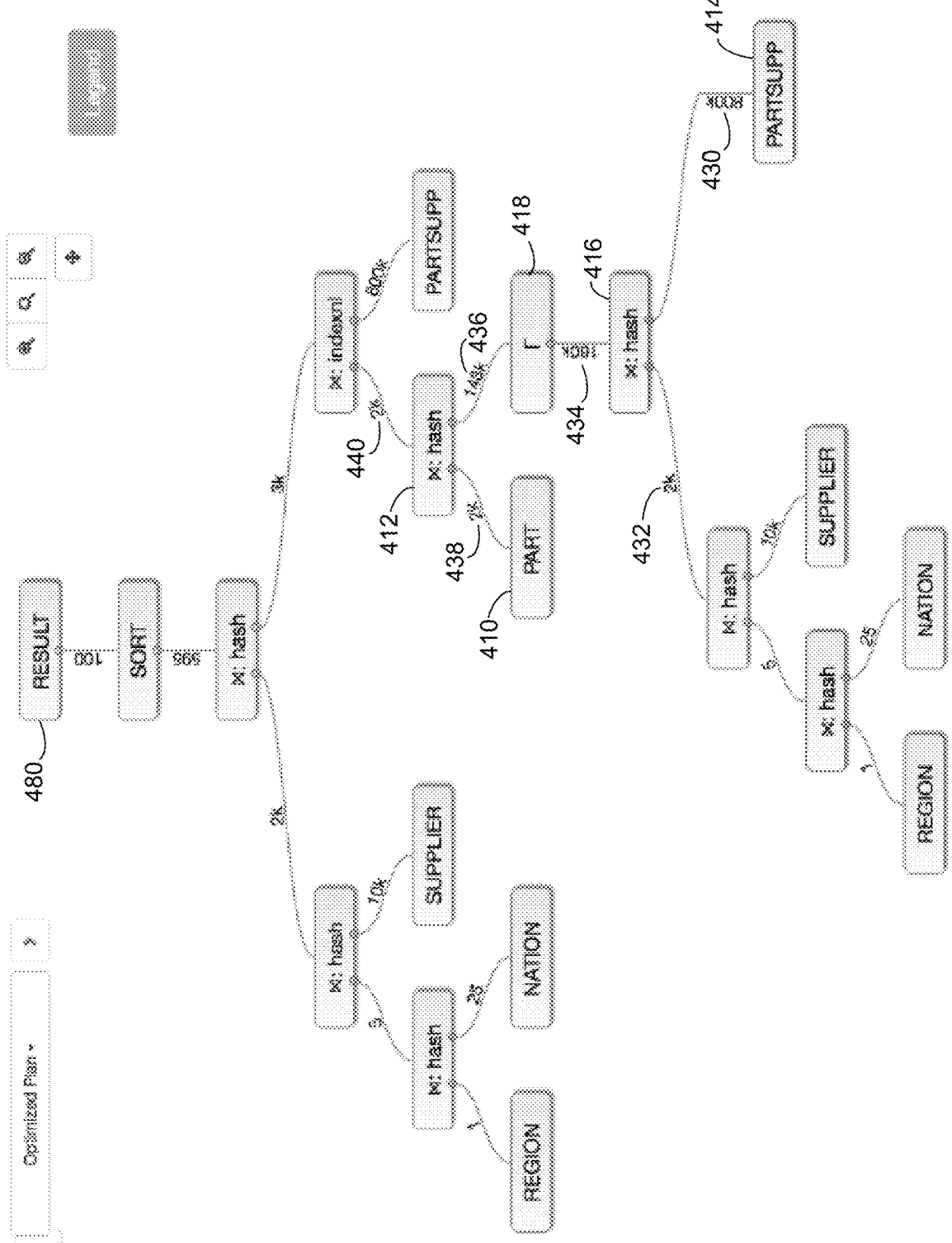
FIGS. 4B and 4C illustrate operator trees for the database query in FIG. 4A, in accordance with some implementations.
Figure 4C:
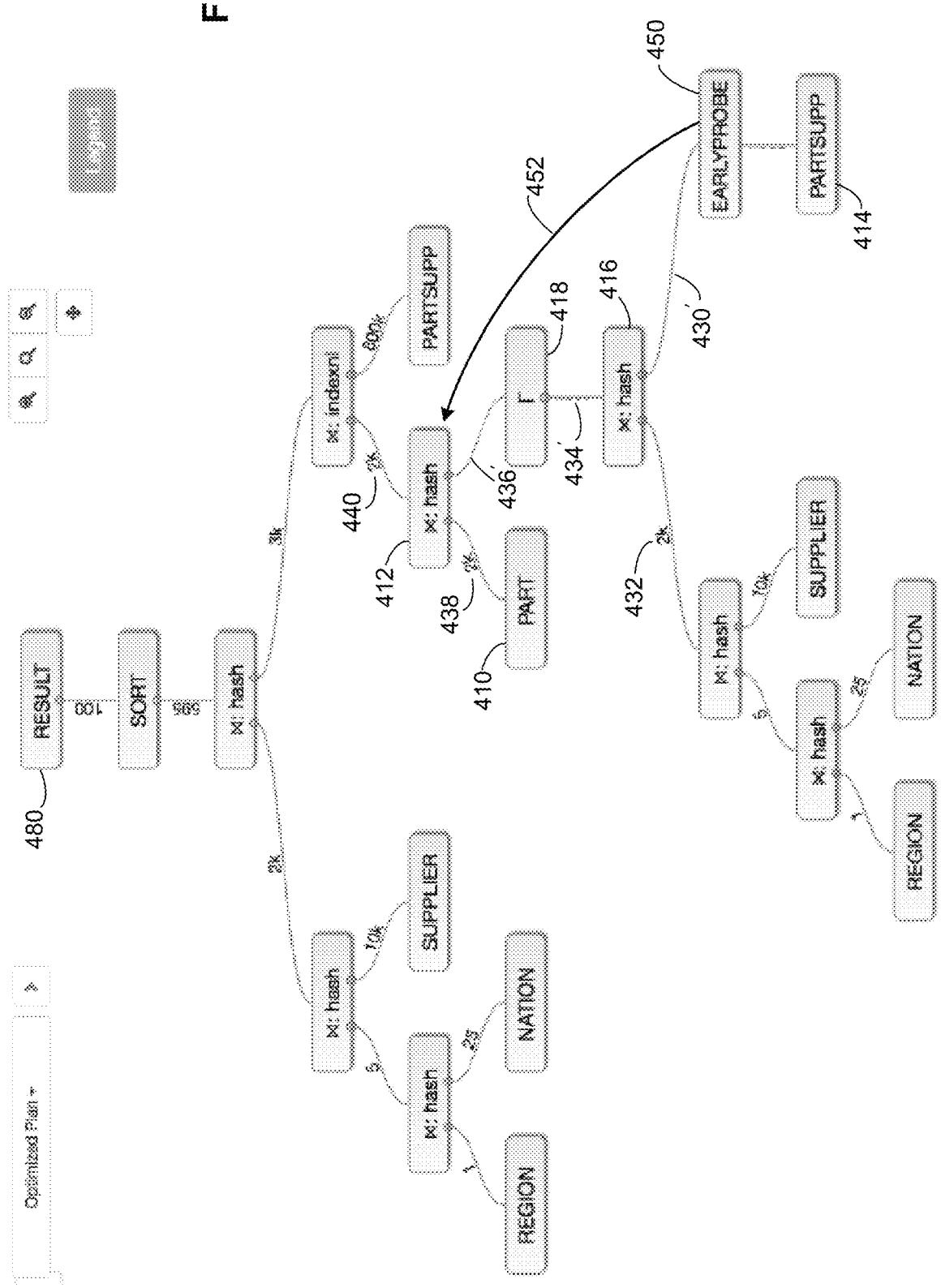

FIGS. 4A-4C illustrate one example of applying a domain constraint to a subtree based on a filter condition that appears later in the operator tree. The same disclosed techniques can be applied to many other types of queries as well.

FIG. 4A shows an example of a query that contains a subquery. This is a slightly modified version of the Transaction Processing Performance Council (TPC) Benchmark™ H Query 2. The query is a human-readable database query expressed in SQL. This query may be entered through an input device 210 of a computing device 200, generated by a data visualization application 222 running on a computing device 200, generated by a data visualization server 104, or created by other applications running on a computing device 200.

The example query uses five tables, as specified in the "from" clause, and each of the tables is given a local alias: part, supplier, partsupp, nation, and region. The "select" clause specifies the selected data fields from three of these tables. The fields acctbal, name, address, phone, and comment are selected from the supplier table; the name field is selected from the nation table; and the fields partkey and mfgr are selected from the part table.

The "where" clause specifies the join conditions between the five tables, specifies three filter conditions, and specifies a correlated subquery to identify the minimum "supplycost" for each part. The joins are based on the primary keys of the part table, the partsupp table, the nation table, and the region table (i.e., partkey, suppkey, nationkey, and regionkey).

The example query 226 filters the results to a small set. In particular, the part size is limited to 15 and the part type is limited to those whose type names end with "BRASS" (i.e., like "% BRASS"). The parts are also limited to those available in the "EUROPE" region.

The final filter condition uses a correlated subquery that finds the lowest cost for each part (i.e., min(ps.supplycost)). Note that there can be multiple instances of suppliers who are providing the same part at the lowest price. Also note that the joins in the correlated subquery are the same as the joins in the outer query.

The "order by" clause specifies how the results are returned. Here, the results are ordered first according to the acctbal of the supplier in descending order. The results are further ordered according to the name field in the supplier table, the name field in the nation table, and the partkey field in the part table. The results are limited to at most 100 rows.

FIG. 4B shows an operator tree 228 corresponding to the query 226 in FIG. 4A. The leaf nodes in the operator tree 228 are tables, including the PART table 410 and the PARTSUPP table 414. The non-leaf nodes represent operators, including the hash joins 412 and 416. The F operator 418 represents the aggregation operation min(ps.supplycost), which computes a minimum cost for each of the parts. At the top of the operator tree 228 is the result set 480, which is returned to the client.

Between each pair of nodes, FIG. 4B shows the number of rows from the lower node that are processed by the upper node. For example, the PARTSUPP table 414 has about 800K rows (430), which are all passed on to the subsequent hash join 416. This hash join operator 416 also receives about 2000 rows (432) from the subtree that joined REGION, NATION, and SUPPLIER. This hash join 416 creates about 160K rows (434), which are grouped together by part according to the F operator 418 to produce about 143K rows (436). These 143K rows are processed by the next hash join 412, together with the 2000 rows (438) from the PART table 410. This hash join 412 creates about 2000 rows (440), which are processed further in the operator tree 228.

The lower right part of this operator tree adds significant inefficiency because 800,000 rows from the PARTSUPP table are processed by the hash join 416 and the aggregate operator F 418 before finally being limited to a small number of relevant rows. In particular, the hash join 416 of PARTSUPP with the subtree from (REGION, NATION, SUPPLIER) generates a huge intermediate result set (i.e., supplier information for all PARTs that the eCommerce company has on sale). However, the PARTs of interest are highly filtered to only about 1% of all PARTS in later stages of the evaluation plan. This subsequent filtering is unknown in the lower subtree because it is independently evaluated.

FIG. 4C illustrates inserting a domain constraint into the operator tree 228 to optimize the processing. The optimizer 244 analyzes the operator tree 228 to detect that later in the tree the supplier information is only needed for specific PARTs (those having size 15 and made of brass). So, the optimizer 244 injects an operator 450 that restricts the domain of the subquery by consulting other execution subtrees.

The early probe operator 450 makes use of the hash table that is already built for the hash join 412. Before processing a PARTSUPP row, the early probe operator 450 inspects (452) this hash table to determine whether or not this row is needed later on in the query evaluation. If the corresponding key partkey is not found in the hash table, the row is discarded from further processing. Based on the early probe operator 450, the number of rows (430') in the intermediate result set is much smaller than the 800,000 rows (430) that are in the corresponding intermediate result set without the injected early probe. The reduced cardinality 430' of this intermediate result set also creates reduced cardinalities 434' and 436' for the next two intermediate result sets.

Figure 5A:
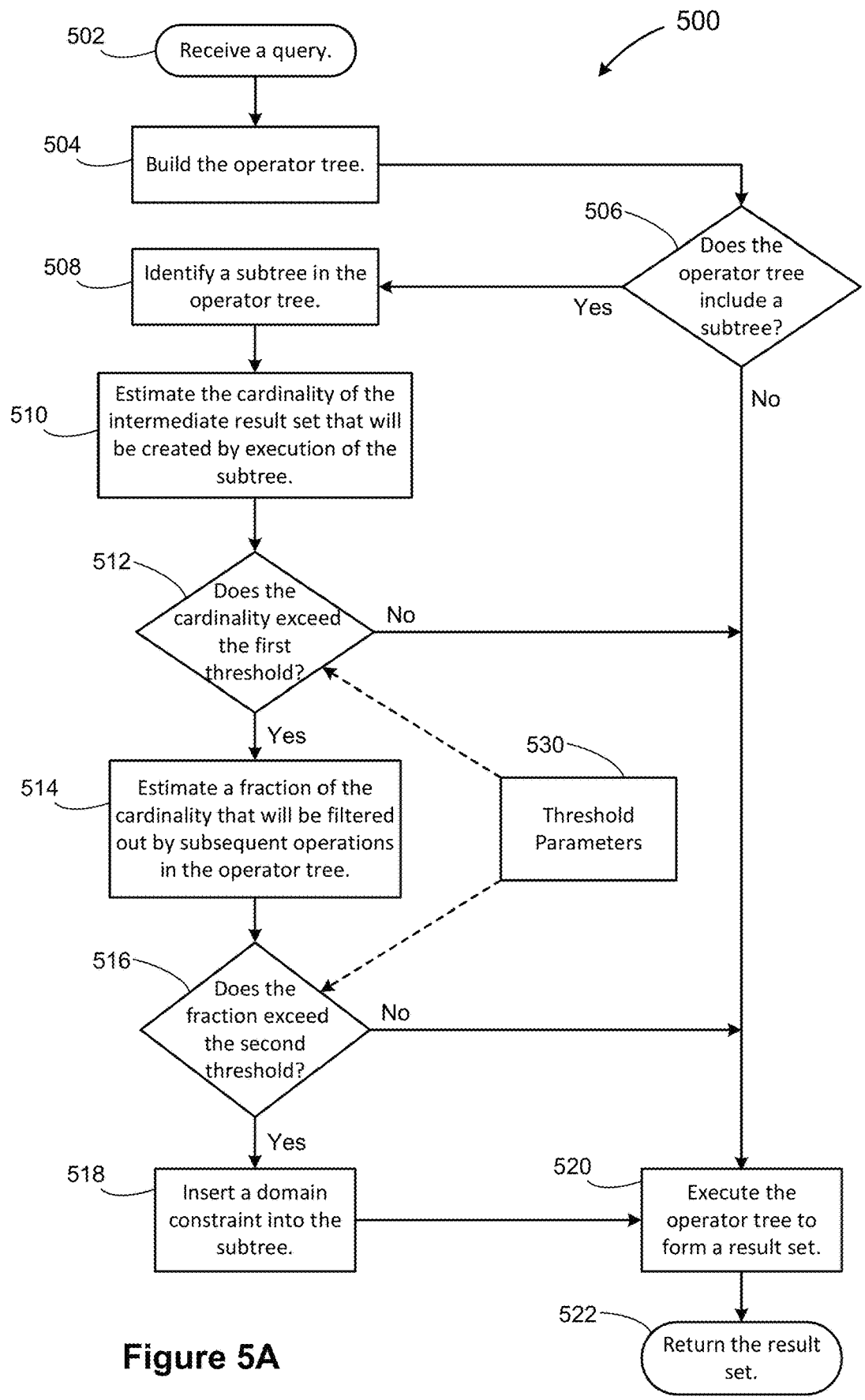
FIG. 5A is a process flow diagram that illustrates a process for modifying an operator tree according to some implementations.

FIG. 5A illustrates a process 500 for building and executing an operator tree 228 for a database query 226 according to some implementations. In some cases, the logical optimizer 244 modifies the operator tree 228 to improve performance. The process 500 receives (502) a query 226 (e.g., the query shown in FIG. 4A), which may include a subquery. The parser 238 parses (504) the query 226 to build an operator tree 228. The process 500 (e.g., the optimizer 244) then determines (506) whether the operator tree 228 includes at least one subtree. If not, the process 500 proceeds to executing (520) the operator tree 228 and returning (522) the result set. In some implementations, the optimizer 244 evaluates other optimization strategies as well before executing the operator tree.

When there is at least one subtree in the operator tree 228, the process identifies (508) one of the subtrees, and then estimates (510) the cardinality of the intermediate result set that will be created by execution of the subtree. In some implementations, estimating the cardinality is based on stored statistical data about the tables accessed in the subquery (e.g., how many rows are in each of the tables). In some implementations, estimating the cardinality is based on saved information of previously executed queries for the same or similar tables. In some implementations, estimating the cardinality includes computing the product of the cardinalities of the tables included in the subtree (e.g., assuming a Cartesian product). In some implementations, estimating the cardinality of the intermediate result set includes computing a sum of the cardinalities of the tables included in the subtree. In some implementations, estimating the cardinality of the intermediate result set includes computing a maximum of the cardinalities of the tables included in the subtree. In some implementations, estimating the cardinality uses machine learning based on stored historical data of the same or similar tables (e.g., using a trained neural network or support vector machine).

The optimizer 244 then determines (512) whether the estimated cardinality exceeds a first threshold 246. When the estimated cardinality does not exceed the first threshold 246, the process 500 proceeds to execute (520) the operator tree 228 (e.g., the original operator tree). When the cardinality does exceed the first threshold, the process estimates (514) the fraction of the cardinality that will be filtered out by subsequent operations in the operator tree. The optimizer 244 determines (516) whether the fraction exceeds the second threshold 248. When the fraction of the cardinality that will be filtered out subsequently does not exceed the second threshold 248, the original operator tree is executed (520). When the fraction does exceed the second threshold 248, the optimizer inserts (518) a domain constraint into the operator tree 228. The inserted domain constraint filters out at least some of the superfluous rows that would have been in the intermediate result set for the subtree. This is illustrated above in FIGS. 4B and 4C.

When later operations in an operator tree will not use a substantial fraction of the results (e.g., the results are filtered out), the inserted domain constraint can reduce the overall cost of identifying the results responsive to the query. By executing the modified operator tree (e.g., with the domain constraint), the database engine may decrease processing time and decrease the resources required to return the result set.

In some cases, an operator tree 228 has two or more subtrees. In general, each of the subtrees is evaluated as described by steps 508-518 in the process 500. In some cases, the analysis of each subtree occurs independently of the other subtrees, in which case the analysis of the subtrees can proceed at least partially in parallel. However, in some cases, the results of one subtree can have a direct effect on a subsequent subtree. For example, by inserting a domain constraint into subtree A 302 in FIG. 3, the intermediate result set 320 for this subtree is reduced. This also directly affects the size of the intermediate result set 324 for the lower operator 312. Because of this scenario, some implementations push down domain constraints as far as possible in the operator tree. This generally creates the best overall efficiency.

In some implementations, the first threshold 246 and the second threshold 248 are stored as threshold parameters 530. In some implementations, the first threshold 246 and the second threshold 248 are applied independently as illustrated by the process 500. In other implementations, these thresholds are effectively combined into a single threshold and a computed function of the two estimates is compared to the combined threshold. For example, determine whether f(estimate 1, estimate 2)>combined threshold, where f is a function of the two estimates. Some implementations also evaluate the probable accuracy of the estimates, and only insert a domain constraint when the probability is sufficiently high to justify the overhead.

The final steps in FIG. 5 have been simplified to specify executing the operator tree 228, but the process is typically more complex. In some implementations, the intermediate compiler 242 compiles the operator tree 228 (whether modified or not) into an intermediate representation 230, and the intermediate representation is interpreted by the query interpreter 240 to build the result set. In some implementations, the machine code compiler 250 compiles the intermediate representation to create executable machine code 232, and the query execution module 250 executes that machine code 232. Executing the machine code 232 builds the result set. The database engine 120 returns the result set to the client that initiated the query. The "client" may be an application running on the same computing device 200 as the database engine 120 or on a remote computing device 200.

Figure 5B:
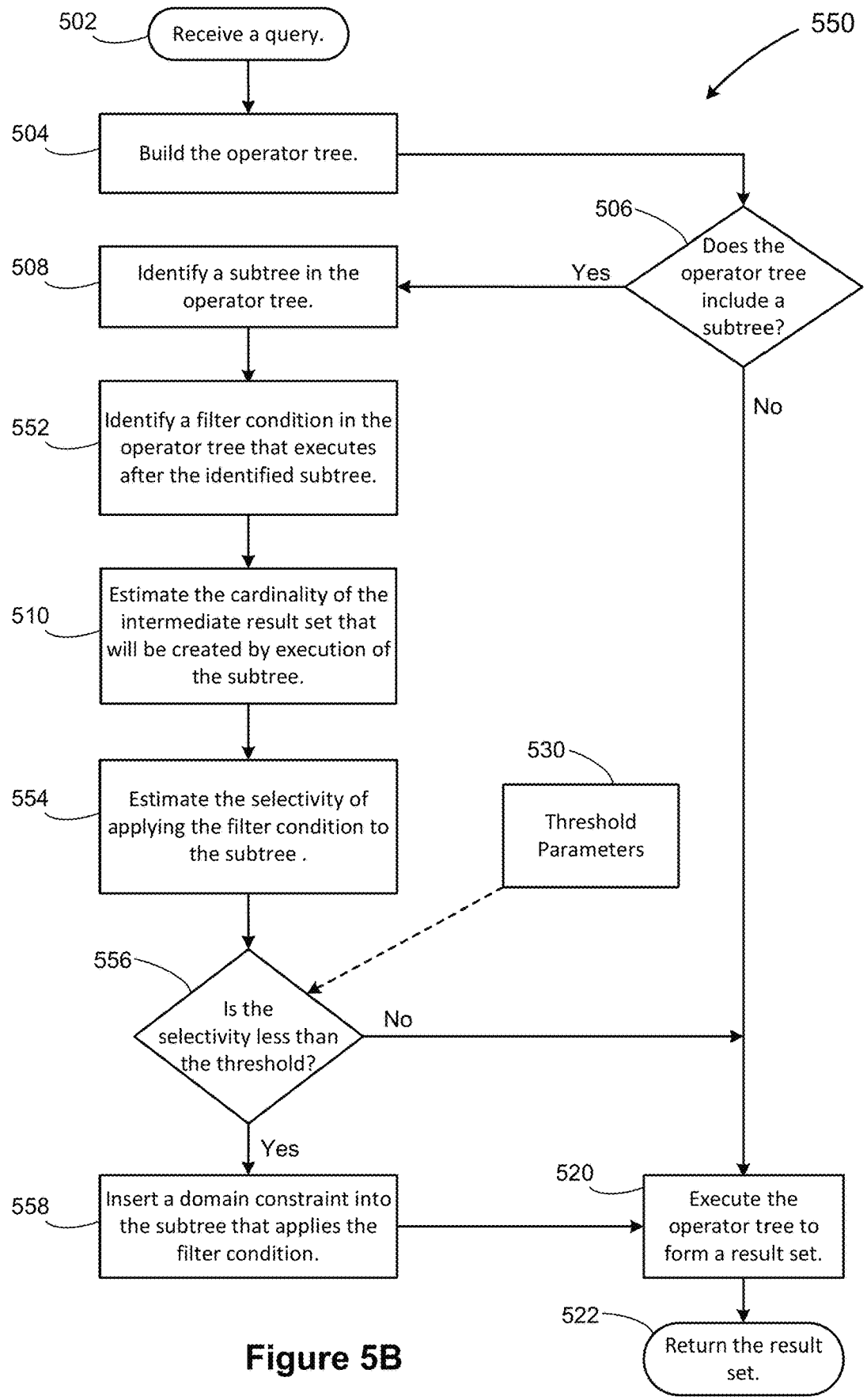
FIG. 5B is an alternative process flow diagram that illustrates a process for modifying an operator tree according to some implementations.

FIG. 5B illustrates an alternative process 550 for building and executing an operator tree 228 for a database query 226 according to some implementations. Many of the steps in the alternative process 550 are the same as the first process 500 illustrated in FIG. 5A, so they have the same reference numbers. The descriptions of these elements are not repeated.

The alternative process 550 identifies (552) a filter condition in the operator tree that executes after the identified subtree. For example, in FIG. 4B, all of the nodes up to and including the hash join 416 form a subtree, and the hash join 412 filters the rows to a very specific set of parts (e.g., size=15).

The selectivity of the filter condition with respect to the subtree measures the fraction of rows from the subtree that "survive" applying the filter condition. Selectivity values range from 0 (no rows survive the filter condition) to 1 (all rows survive the filter condition). A highly selective filter condition is one with a value closer to 0 (e.g., 0.05, 0.01, or lower).

The process 550 estimates (554) the selectivity of applying the filter condition to the subtree. In some implementations, the process 550 uses sampling to estimate the selectivity. For example, some implementations identify a small random (or pseudo-random) sample of rows from the tables specified in the subtree. The operators in the operator tree are applied to the sample to determine how many of the rows are retained instead of being filtered out.

The process then determines (556) whether the selectivity is less than a predefined threshold (e.g., a first threshold 246). If so, the process 550 inserts (558) a domain constraint into the subtree that applies the filter condition. In this alternative process 550, only one threshold is used, and it is compared against the selectivity.

As illustrated by FIGS. 5A and 5B, different implementations use different numbers of thresholds, and compare different estimated values to the thresholds. In the first process 500 in FIG. 5A, a domain constraint is added only when the number of rows is large and there is high selectivity (i.e., many rows are filtered out). In the second process 550 in FIG. 5B, selectivity alone is used. Some implementations use other estimates, or combined estimates, to determine whether to insert a domain constraint. For example, some implementations estimate the overhead cost of implementing an early probe operation. When the overhead is too high, no domain constraint is added to the subtree. Generally, the estimates used are either relevant to expected time savings by applying a domain constraint or are relevant to the expected cost of applying the domain constraint. Some implementations also factor in the overhead of computing the estimates. Specifically, some implementations set the one or more thresholds so that the overall average query processing time is decreased by the application of domain constraints. For example, if 10,000 distinct queries are run during a single day, appropriate selection of the parameters reduces the average processing time for the 10,000 queries. Some implementations log each query, including whether a domain constraint is inserted, and iteratively update the threshold parameters based on the measured performance.

Figure 6A:
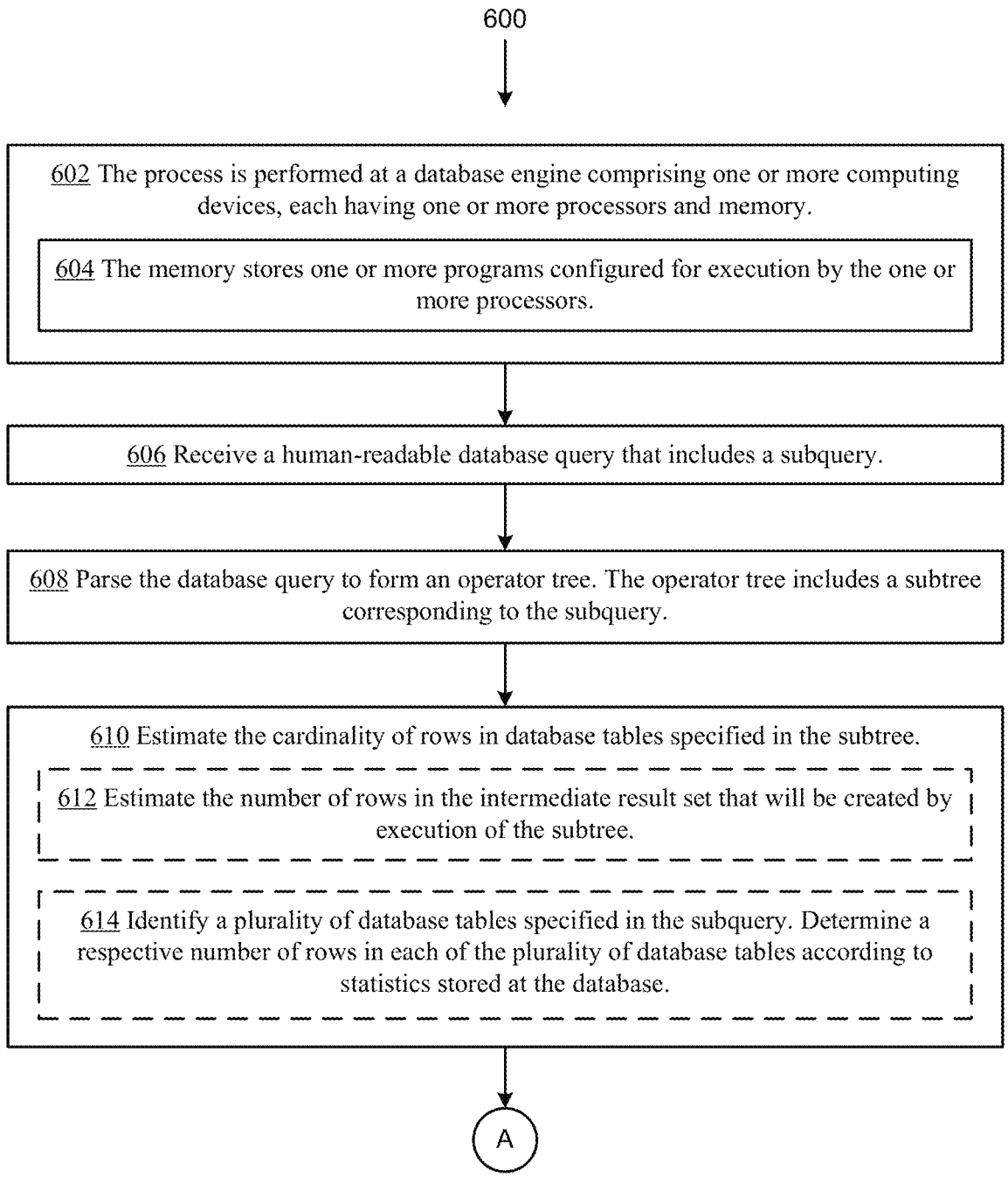
FIGS. 6A-6C provide a flowchart of a process for building and executing a modified operator tree according to some implementations.
Figure 6B:
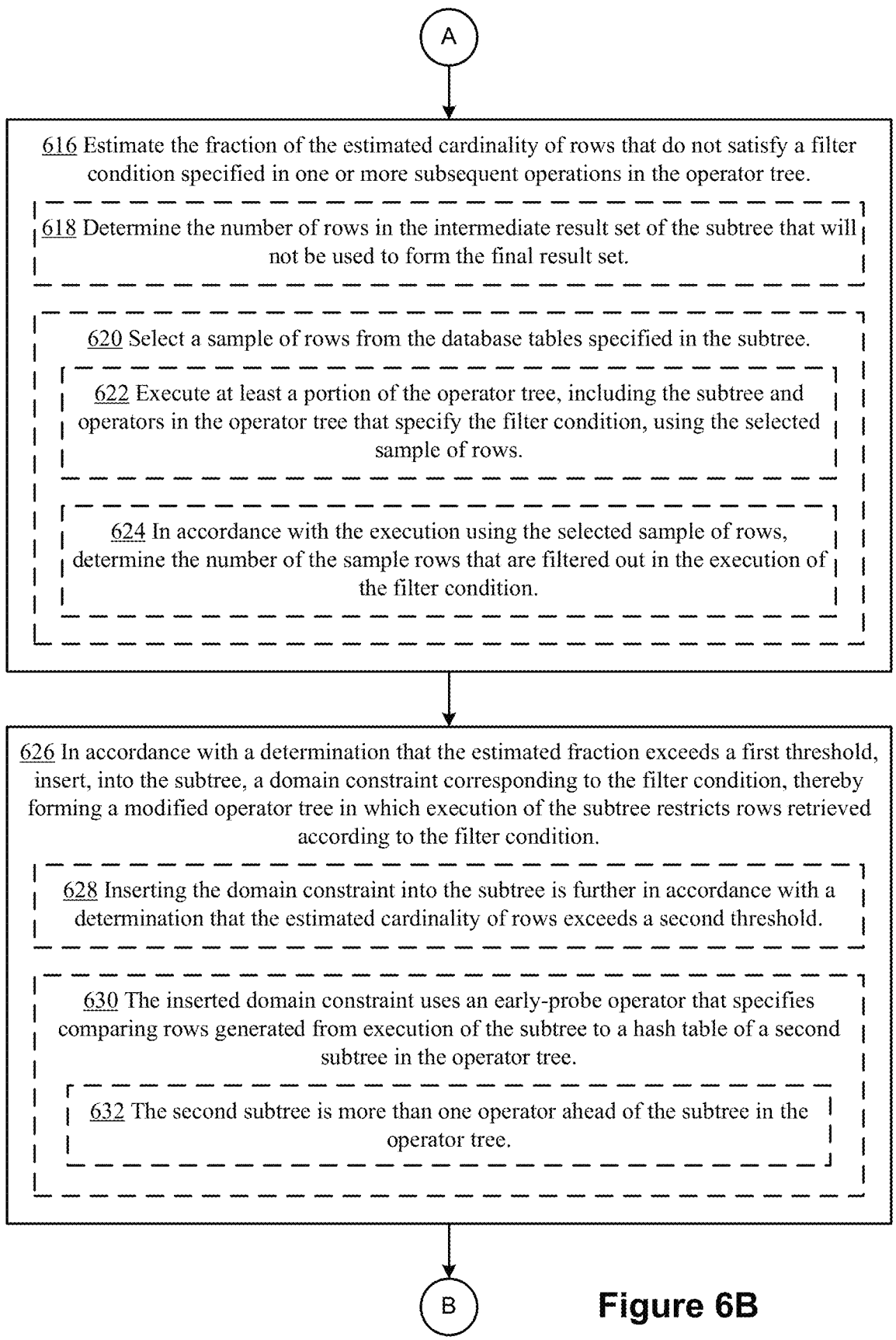
Figure 6C:
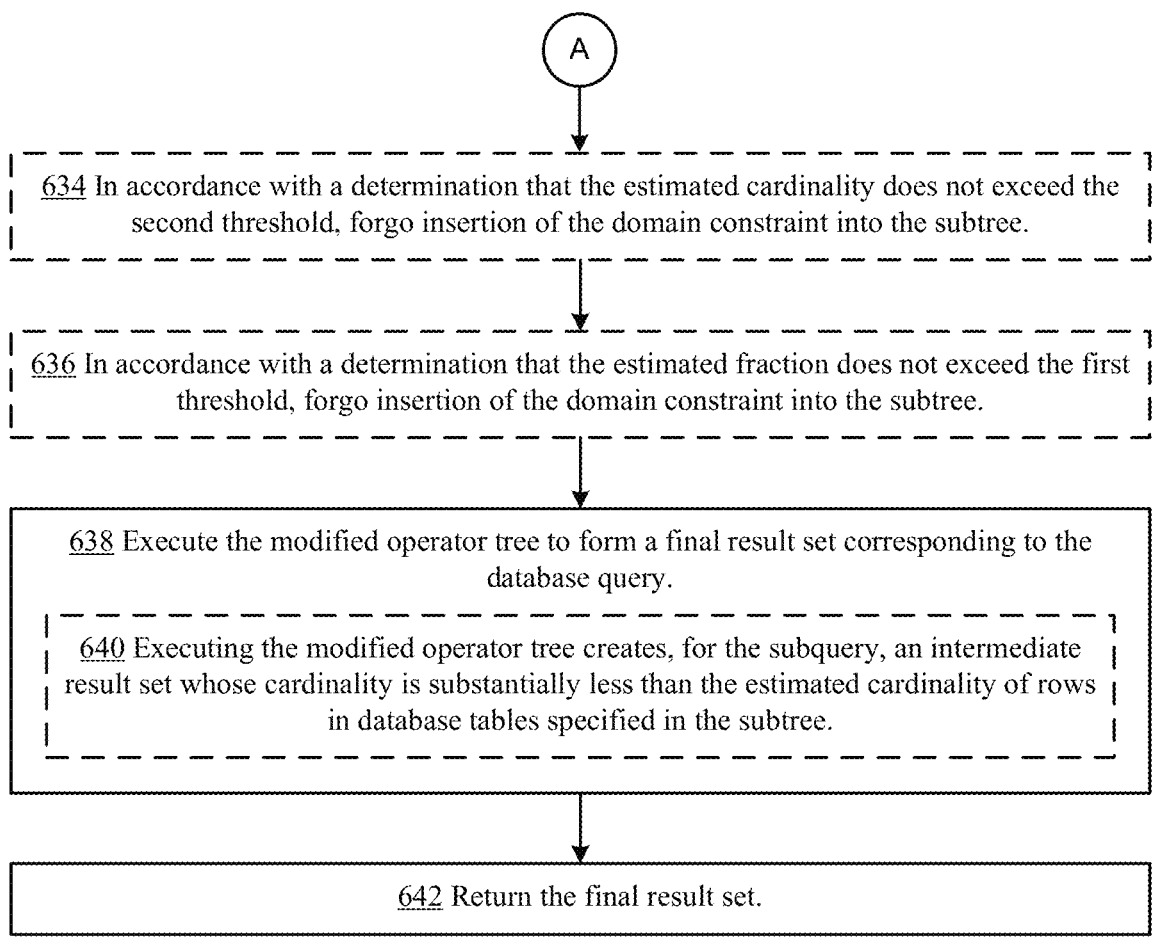

FIGS. 6A-6C provide a flowchart of a process 600 for retrieving data from a database. The process 600 is performed at a database engine comprising (602) one or more computing devices, each having one or more processors and memory. The memory stores (604) one or more programs configured for execution by the one or more processors.

The database engine 120 receives (606) a human-readable database query 226, which includes a subquery. The database engine 120 (or the query parser 228 within the database engine) parses (608) the database query 226 to form an operator tree 228. The operator tree 228 includes a subtree that corresponds to the subquery. In some instances, the database 226 query includes a plurality of subqueries and the operator tree 228 includes a plurality of subtrees, each corresponding to a respective one of the subqueries.

The logical optimizer 244 estimates (610) the cardinality of rows in database tables specified in the subtree. In some implementations, the optimizer 244 estimates (612) the number of rows in the intermediate result set that will be created by execution of the subtree. In some implementations, the optimizer 244 identifies (614) a plurality of database tables specified in the subquery. The optimizer 244 then determines the respective number of rows in each of the plurality of database tables according to statistics stored at the database.

The logical optimizer 244 also estimates (616) the fraction of the estimated cardinality of rows that do not satisfy a filter condition specified in one or more subsequent operations in the operator tree. This represents what percentage of rows created by the subtree are superfluous (e.g., illustrated by the filled dots in FIG. 3). Note that this fraction is essentially the inverse of selectivity. When the estimated fraction is close to 1, the estimated selectivity is close to 0. In some implementations, the logical optimizer estimates (618) the number of rows in the intermediate result set of the subtree that will not be used to form the final result set. In some implementations, database statistics include the number of rows in each of the tables or counts of rows in the tables that have specific field values for specific fields. For example, statistics for the supplier table in FIG. 4A may include the number of suppliers having each value of the field nationkey. When a subsequent filter condition limits the rows (e.g., p.size=15 and p.type like '% BRASS' in FIG. 4A), database statistics about the distribution of values can be used to estimate the fraction.

In some implementations, the fraction is estimated using a sampling of data. For example, some implementations select (620) a sample of rows from the database tables specified in the subtree, and execute (622) at least a portion of the operator tree, including both the subtree and operators in the operator tree that specify the filter condition. By executing the portion of the operator tree using the selected sample of rows, the process 600 determines (624) the number of the sample rows that are filtered out in the execution of the filter condition. In some implementations, the executed portion is simplified so that only relevant operators (e.g., the filtering operators) are executed.

When the estimated fraction exceeds (626) the first threshold, the logical optimizer 244 inserts (626) a domain constraint into the subtree. The domain constraint corresponds (626) to the filter condition. This forms (626) a modified execution tree in which execution of the subtree restricts rows retrieved according to the filter condition. In some implementations, whether to insert a domain constraint is based on just the estimated fraction (or the estimated selectivity). In some implementations, whether to insert a domain constraint is further based on (628) determining that the estimated cardinality of rows from the subtree exceeds a second threshold. Some implementations combine these two estimated values (and/or other estimated values), and compare the combined value to a predetermined threshold to determine whether to insert a domain constraint.

In some implementations, the inserted domain constraint uses an early-probe operator that specifies (630) comparing rows generated from execution of the subtree to a hash table of a second subtree in the operator tree. This is illustrated by the early probe operator 450 in FIG. 4C. In some instances, the second subtree is (632) more than one operator ahead of the subtree in the operator tree, as illustrated in FIG. 3. In some implementations, the inserted domain constraint imposes a filter in the subtree, which eliminate rows that will not be used by other operations in the operator tree.

An early-probe operator is one technique used to implement domain constraints in the subtree. In many cases this is efficient because the hash table for a subsequent operation has already been created. Some implementations impose domain constraints in alternative ways, such as Bloom filters. In some implementations, the process builds a Bloom filter during construction of the hash table, and the Bloom filter is used later rather than probing the hash table. Some implementations identify the operators that form the subsequent filter and recreate those operators locally as a domain constraint within the subtree.

In some implementations, when the estimated cardinality does not exceed the second threshold 248, the optimizer 244 forgoes (634) insertion of the domain constraint into the subtree. In some implementations, when the estimated fraction does not exceed the first threshold 246, the optimizer 244 forgoes (636) insertion of the domain constraint into the subtree. Thus, whether one or both of the first threshold 246 or the second threshold 248 is not satisfied, the optimizer 244 does not modify the operator tree. In some implementations, the database engine 120 executes the original (e.g., unmodified) operator tree as created in step 608.

In some implementations, the database engine 120 executes (638) the modified operator tree (e.g., using query execution module 260) to form a final result set corresponding to the database query 226. In some implementations, executing the modified operator tree creates (640) an intermediate result set for the subquery whose cardinality is substantially less than the estimated cardinality of rows in database tables specified in the subtree. In some implementations, "substantially less" is 1%, 5%, 10%, or 25%. The database engine 120 returns (642) the final result set.

FIGS. 7A and 7B provide source code used in some implementations. After logically optimizing the operator tree 228, post-processing analysis of the resulting operator tree 228 determines whether to apply an early probe to constrain the domain of a subtree evaluation. Whether or not early probing is injected into an operator tree 228 is determined based on cost and cardinality estimates, as illustrated by the exemplary code in FIG. 7A. Exemplary code to inject the early probe into the operator tree 228 is illustrated in FIG. 7B.

Early probe filtering introduces its own overhead cost, but usually pays off well by reducing intermediate result set cardinalities. The thresholds 246 and 248 described above insure that domain constraints are only inserted when there is sufficient return on the investment.

The terminology used in the description of the invention herein is for the purpose of describing particular implementations only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

The foregoing description, for purpose of explanation, has been described with reference to specific implementations. However, the illustrative discussions above are not intended to be exhaustive or to limit the invention to the precise forms disclosed. Many modifications and variations are possible in view of the above teachings. The implementations were chosen and described in order to best explain the principles of the invention and its practical applications, to thereby enable others skilled in the art to best utilize the invention and various implementations with various modifications as are suited to the particular use contemplated.

What is claimed is:

1. A database engine, comprising:
   one or more computing devices, each having one or more processors and memory, wherein the memory stores one or more programs configured for execution by the one or more processors, the one or more programs comprising instructions for:
   receiving a human-readable database query that includes a subquery;
   parsing the database query to build an operator tree, which includes a subtree corresponding to the subquery;
   estimating a cardinality of rows in database tables specified in the subtree;
   estimating a fraction of the estimated cardinality of rows that do not satisfy a filter condition specified in one or more subsequent operations in the operator tree;
   in accordance with a determination that the estimated fraction exceeds a first threshold, inserting, into the subtree, a domain constraint that includes an early-probe operator that specifies comparing rows generated from execution of the subtree to a hash table of a second subtree in the operator tree, the domain constraint corresponding to the filter condition, thereby forming a modified operator tree in which execution of the subtree restricts rows retrieved according to the filter condition;
   executing the modified operator tree to form a final result set corresponding to the database query; and
   returning the final result set.

2. The database engine of claim 1, wherein inserting the domain constraint into the subtree is further in accordance with a determination that the estimated cardinality of rows exceeds a second threshold.

3. The database engine of claim 1, wherein estimating the cardinality of rows in database tables specified in the subtree comprises estimating a number of rows in an intermediate result set that will be created by execution of the subtree.

4. The database engine of claim 3, wherein estimating the fraction of the estimated cardinality of rows that do not satisfy the filter condition comprises determining a number of rows in the intermediate result set of the subtree that will not be used to form the final result set.

5. The database engine of claim 1, wherein the second subtree is more than one operator ahead of the subtree in the operator tree.

6. The database engine of claim 1, wherein estimating the fraction of the estimated cardinality of rows that do not satisfy the filter condition comprises:
   selecting a sample of rows from the database tables specified in the subtree;
   executing at least a portion of the operator tree, including the subtree and operators in the operator tree that specify the filter condition, using the selected sample of rows; and
   in accordance with the execution using the selected sample of rows, determining a number of the sample rows that are filtered out in the execution of the filter condition.

7. The database engine of claim 1, wherein executing the modified operator tree creates, for the subquery, an intermediate result set whose cardinality is substantially less than the estimated cardinality of rows in database tables specified in the subtree.

8. The database engine of claim 1, further comprising, in accordance with a determination that the estimated fraction does not exceed the first threshold, forgoing insertion of the domain constraint into the subtree.

9. The database engine of claim 1, further comprising, in accordance with a determination that the estimated cardinality does not exceed a second threshold, forgoing insertion of the domain constraint into the subtree.

10. The database engine of claim 1, wherein estimating the cardinality of rows in database tables specified in the subtree comprises:
    identifying a plurality of database tables specified in the subquery; and
    determining a respective number of rows in each of the plurality of database tables according to statistics stored at the database.

11. A method of retrieving data from a database, comprising:
    at a computer system having one or more computing devices, each computing device having one or more processors and memory storing one or more programs configured for execution by the one or more processors:

receiving a human-readable database query that includes a subquery;

parsing the database query to build an operator tree, which includes a subtree corresponding to the subquery;

estimating a cardinality of rows in database tables specified in the subtree;

estimating a fraction of the estimated cardinality of rows that do not satisfy a filter condition specified in one or more subsequent operations in the operator tree;

in accordance with a determination that the estimated fraction exceeds a first threshold, inserting, into the subtree, a domain constraint that includes an early-probe operator that specifies comparing rows generated from execution of the subtree to a hash table of a second subtree in the operator tree, the domain constraint corresponding to the filter condition, thereby forming a modified operator tree in which execution of the subtree restricts rows retrieved according to the filter condition;

executing the modified operator tree to form a final result set corresponding to the database query; and returning the final result set.

12. The method of claim 11, wherein inserting the domain constraint into the subtree is further in accordance with a determination that the estimated cardinality of rows exceeds a second threshold.

13. The method of claim 11, wherein estimating the cardinality of rows in database tables specified in the subtree comprises estimating a number of rows in an intermediate result set that will be created by execution of the subtree.

14. The method of claim 13, wherein estimating the fraction of the estimated cardinality of rows that do not satisfy the filter condition comprises determining a number of rows in the intermediate result set of the subtree that will not be used to form the final result set.

15. The method of claim 11, wherein estimating the fraction of the estimated cardinality of rows that do not satisfy the filter condition comprises:

selecting a sample of rows from the database tables specified in the subtree;

executing at least a portion of the operator tree, including the subtree and operators in the operator tree that specify the filter condition, using the selected sample of rows; and in accordance with the execution using the selected sample of rows, determining a number of the sample rows that are filtered out in the execution of the filter condition.

16. The method of claim 11, wherein executing the modified operator tree creates, for the subquery, an intermediate result set whose cardinality is substantially less than the estimated cardinality of rows in database tables specified in the subtree.

17. The method of claim 11, wherein estimating the cardinality of rows in database tables specified in the subtree comprises:

identifying a plurality of database tables specified in the subquery; and determining a respective number of rows in each of the plurality of database tables according to statistics stored at the database.

18. A non-transitory computer readable storage medium storing one or more programs configured for execution by a computer system having one or more processors and memory, the one or more programs comprising instructions for:

receiving a human-readable database query that includes a subquery;

parsing the database query to build an operator tree, which includes a subtree corresponding to the subquery;

estimating a cardinality of rows in database tables specified in the subtree;

estimating a fraction of the estimated cardinality of rows that do not satisfy a filter condition specified in one or more subsequent operations in the operator tree;

in accordance with a determination that the estimated fraction exceeds a first threshold, inserting, into the subtree, a domain constraint that includes an early-probe operator that specifies comparing rows generated from execution of the subtree to a hash table of a second subtree in the operator tree, the domain constraint corresponding to the filter condition, thereby forming a modified operator tree in which execution of the subtree restricts rows retrieved according to the filter condition;

executing the modified operator tree to form a final result set corresponding to the database query; and returning the final result set.

* * * * *